(12) United States Patent
Bolandrina et al.

(10) Patent No.: US 8,159,899 B2
(45) Date of Patent: Apr. 17, 2012

(54) WORDLINE DRIVER FOR MEMORY

(75) Inventors: Efrem Bolandrina, Alzano Lombardo (IT); Daniele Vimercati, Besana in Brianza (IT)

(73) Assignee: Micron Technology, Inc., Boise, ID (US)

( * ) Notice: Subject to any disclaimer, the term of this patent is extended or adjusted under 35 U.S.C. 154(b) by 41 days.

(21) Appl. No.: 12/779,752

(22) Filed: May 13, 2010

(65) Prior Publication Data

US 2011/0280097 A1    Nov. 17, 2011

(51) Int. Cl.
*G11C 8/00* (2006.01)

(52) U.S. Cl. ............................. 365/230.06; 365/189.11
(58) Field of Classification Search ............. 365/230.06, 365/189.11
See application file for complete search history.

(56) References Cited

U.S. PATENT DOCUMENTS 5,784,327 A * 7/1998 Hazani ..................... 365/189.03
2008/0315319 A1* 12/2008 Asano et al. ................. 257/377

* cited by examiner

*Primary Examiner* — Huan Hoang
(74) *Attorney, Agent, or Firm* — Berkeley Law & Technology Group, LLP

(57) ABSTRACT

Subject matter disclosed herein relates to accessing memory, and more particularly to a wordline driver of same.

16 Claims, 6 Drawing Sheets

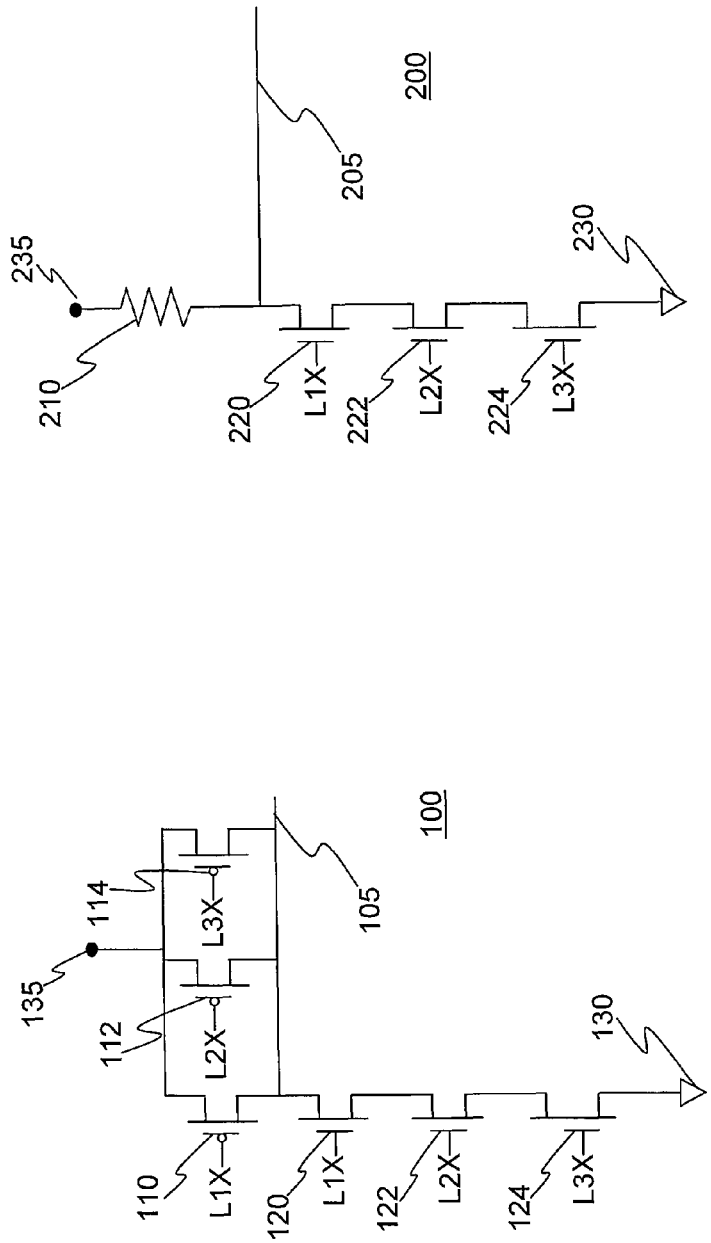

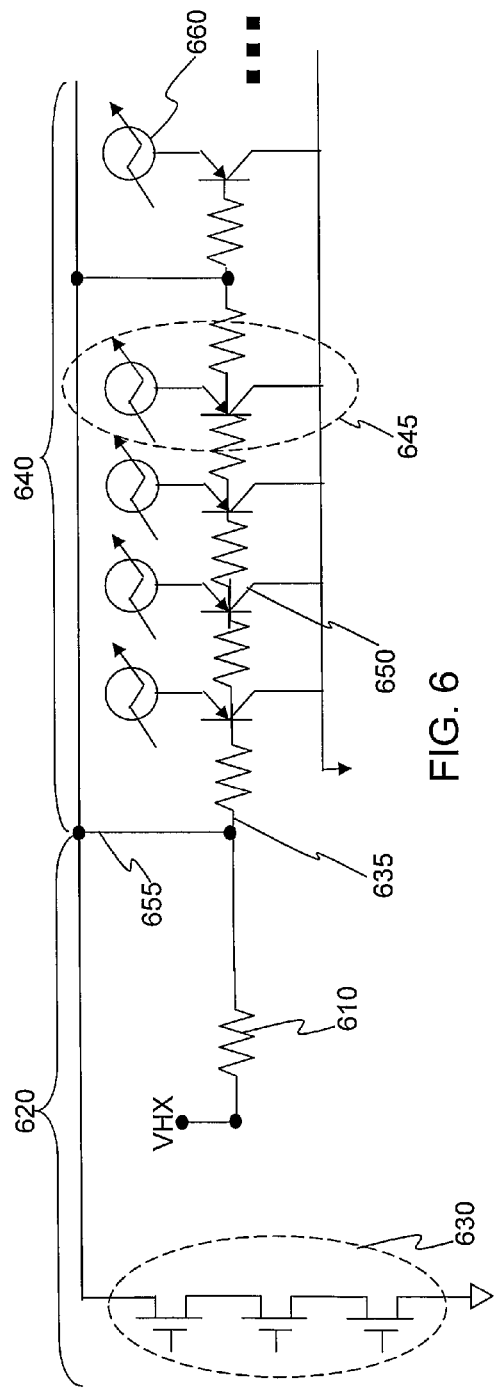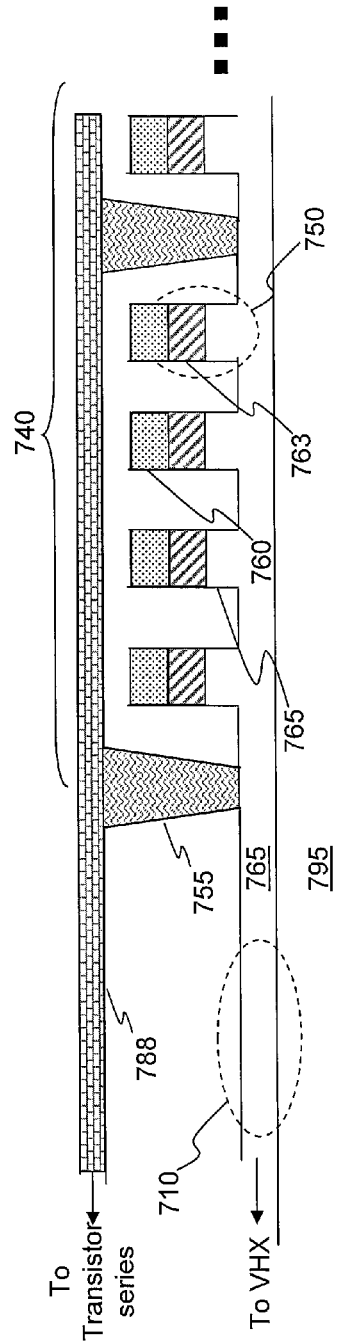
FIG. 6
FIG. 7

WORDLINE DRIVER FOR MEMORY

BACKGROUND

1. Field

Subject matter disclosed herein relates to accessing memory, and more particularly to operation of a wordline driver.

2. Information

Memory devices may be employed in many types of electronic equipment, such as computers, cell phones, PDA's, data loggers, games, and navigational gear, for example. Continuing demand for smaller and/or more capable electronic equipment may lead to a desire for smaller, higher density memory devices, which may involve small semiconductor feature sizes that approach lower boundaries associated with material and electronic behavior at atomic or molecular levels. Accordingly, approaches to increase memory density other than decreasing semiconductor feature sizes may involve new configurations, new circuit layouts, and/or new approaches to operating memory components, for example.

BRIEF DESCRIPTION OF THE FIGURES

Non-limiting and non-exhaustive embodiments will be described with reference to the following figures, wherein like reference numerals refer to like parts throughout the various figures unless otherwise specified.

FIGS. 1-5 are schematic circuit diagrams of wordline drivers, according to embodiments.

FIG. 6 is a schematic a circuit diagram of a wordline driver and a portion of a memory array, according to an embodiment.

FIG. 7 is a cross-section view of a wordline driver and a portion of a memory array, according to an embodiment.

DETAILED DESCRIPTION

Figure 3:
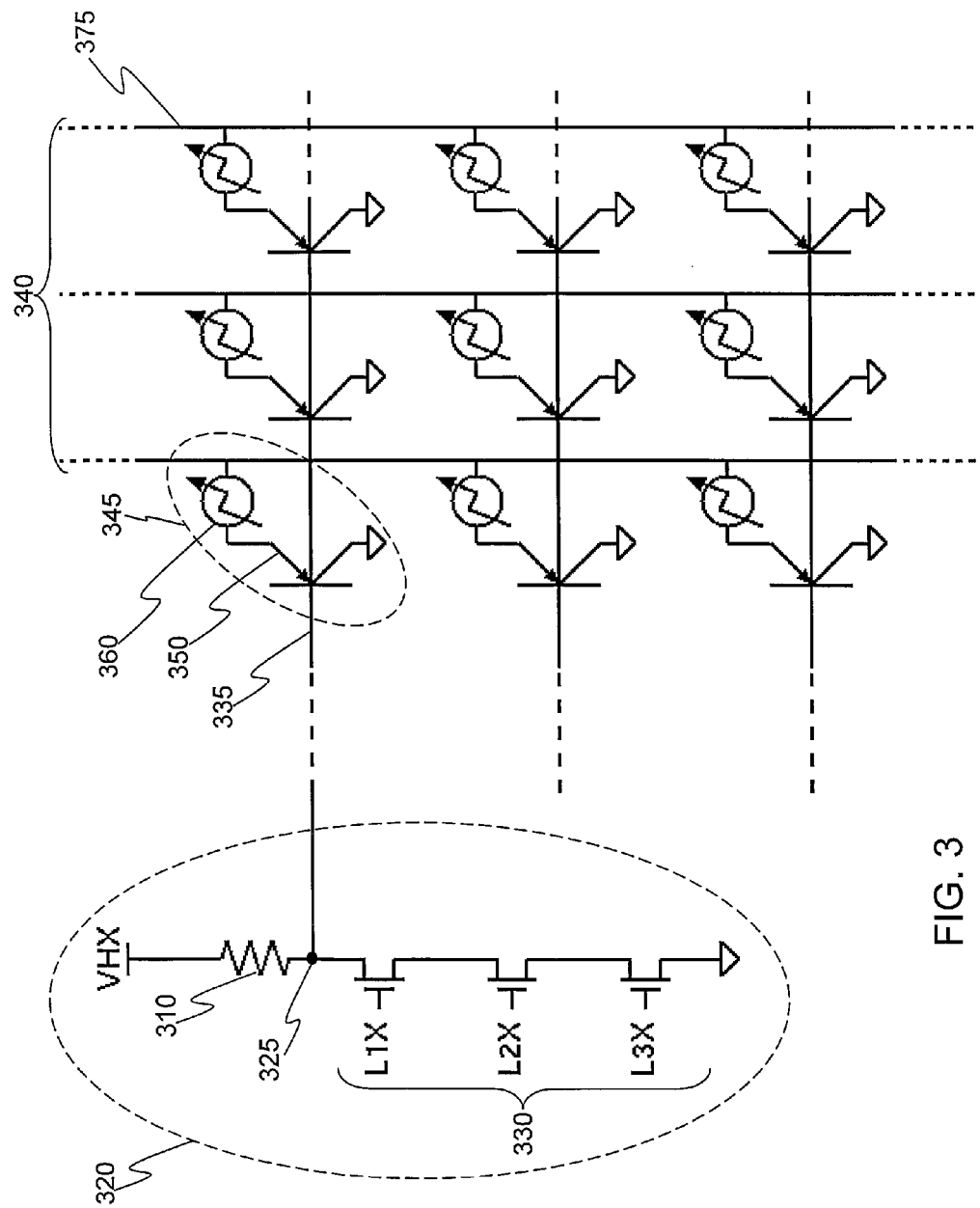

Reference throughout this specification to "one embodiment" or "an embodiment" means that a particular feature, structure, or characteristic described in connection with an embodiment is included in at least one embodiment of claimed subject matter. Thus, appearances of the phrase "in one embodiment" or "an embodiment" in various places throughout this specification are not necessarily all referring to the same embodiment. Furthermore, particular features, structures, or characteristics may be combined in one or more embodiments.

In an embodiment, a process of driving a wordline in a memory array may involve a wordline driver incorporating a particular combination of complementary metal oxide semiconductor (CMOS) transistors and one or more resistors. For example, a pull-down process may be performed using one or more N-channel metal oxide semiconductor field-effect (NMOS) transistors while a pull-up process may be performed using one or more resistors. Such a wordline driver may provide benefits including a reduction in an area of a memory device occupied by such a wordline driver as compared to area of a full CMOS transistor wordline device (e.g., sans resistors). Such a savings in area may be realized without a penalty in performance. For example, circuitry directed to row and column decoding and/or wordline driving in phase-change memory (PCM) or NOR-flash memory may occupy approximately a third of the area occupied by an array of the memory. Such a ratio of occupied areas may depend, at least in part, on desired performance of the memory. Embodiments described herein may allow a reduction of such a proportion of memory area allocated to row-decoding and/or wordline driving functions. Of course, such a benefit is merely an example, and claimed subject matter is not so limited.

In a particular embodiment, a memory device may comprise memory cells of a memory cell array addressable via a wordline, which may correspond to a row of the memory cell array. A memory device may also comprise a series of circuit elements, herein called a pull-up-pull-down (PUPD) string, to select or deselect a wordline of a memory cell array. Such a PUPD string may comprise pull-down transistors electrically connected between a wordline and a current sink to select the wordline, and one or more pull-up resistors electrically connected between the wordline and a voltage source to deselect the wordline. Such pull-up resistors may be serially connected to pull-down transistors as described in further detail below. In a particular implementation, one or more such pull-up resistors may comprise silicon diffusion on or near an edge of a memory cell array. For example, silicon diffusion may comprise an n-type material implanted in a silicon substrate. Pull-up resistors comprising silicon diffusion may be located on or near a beginning of a word line that extends to bases of memory cells in a memory cell array. Of course, claimed subject matter is not limited by such details of a PUPD string as described in the example above.

In another particular embodiment, a memory device may further comprise an additional transistor to inject electrical current into a PUPD string between two consecutive pull-down transistors. Such a configuration may allow deselection of a wordline at a rate faster than that performed without such injected electrical current, as described below in detail. In a particular implementation, an inverter may be electrically connected between a base of one of the consecutive two pull-down transistors and a base of the additional transistor, though claimed subject matter is not so limited.

FIG. 1 is a schematic circuit diagram of a wordline driver 100 incorporating pull-up and pull down CMOS transistors to deselect and select a wordline 105 of a memory cell array (not shown), respectively, according to an embodiment. For example, wordline driver 100 may comprise a power supply 135 node connected to one or more parallel P-channel metal oxide semiconductor field-effect (PMOS) transistors 110, 112, and 114 connected to one or more NMOS transistors 120, 122, and 124 connected to ground or other low voltage 130. In one implementation, row-decoding gate signal L1X may be applied to both PMOS 110 and NMOS 120, row-decoding gate signal L2X may be applied to both PMOS 112 and NMOS 114, and row-decoding gate signal L3X may be applied to both PMOS 114 and NMOS 124. Accordingly, depending on a value of L1X, L2X, and L3X, wordline WL may be pulled-up or pulled down to deselect or select the wordline.

FIG. 2 is a schematic circuit diagram of a wordline driver 200 incorporating a pull-up portion and a pull down portion to deselect and select a wordline 205 of a memory cell array (not shown), respectively, according to an embodiment. For example, wordline driver 200 may comprise a power supply 235 node connected to a PUPD string including a pull-up resistor 210 in series with one or more NMOS transistors 220, 222, and 224 connected to ground or other low voltage 230. In one implementation, row-decoding gate signal L1X may be applied to NMOS 220, row-decoding gate signal L2X may be applied to NMOS 214, and row-decoding gate signal L3X may be applied to NMOS 224. Accordingly, depending on a value of L1X, L2X, and L3X, wordline WL may be pulled-up or pulled down to deselected or selected the wordline. As will be described in greater detail below, pull-up resistor 210 may be implemented using silicon diffusion on an edge of a memory array. Of course, such details of a wordline driver are merely examples, and claimed subject matter is not so limited.

FIG. 3 is a schematic circuit diagram of a wordline driver applied to a portion of a memory array 340, according to an embodiment. Memory array 340 may comprise rows and columns of memory cells 345. As explained below, individual columns may correspond to bit lines. Individual rows, corresponding to wordlines 335 of memory cells may be selected or deselected based, at least in part, on a voltage level of the wordlines established by PUPD string 320. In a particular implementation, individual memory cells 345 may comprise a selector transistor 350 connected to a storage cell 360, which may comprise a PCM cell, a NOR flash memory cell, or other type of storage cell, for example. A number of memory cells 345 sharing a base connection of respective selector transistors 350 may comprise wordline 335. A number of memory cells 345 sharing an emitter connection of respective selector transistors 350 may comprise a bitline 375, for example. To select a particular memory cell 345 for a read and/or write operation, selector transistor 350 corresponding to the particular memory cell may be turned on by pulling down a voltage on wordline 335. On the other hand, to deselect a particular memory cell 345, selector transistor 350 corresponding to the particular memory cell may be turned off by pulling up a voltage on wordline 335. Such pulling down or pulling up a voltage on a wordline may be performed by PUPD string 320, which may comprise wordline driver 200 as shown in FIG. 2, though claimed subject matter is not so limited. In particular, PUPD string 320 may comprise a pull-up resistor 310. Node 325 may connect pull-up resistor 310 and NMOS transistor string 330. A wordline 335 of memory array 340 may connect to PUPD string 320 via node 325.

Though a number of configurations are possible, in a particular embodiment, wordline selection (pull-down) may be performed using NMOS transistor string 330. Such a string of NMOS transistors 330 may be selected to hierarchically select various numbers of wordlines. In one implementation, for example, a first NMOS transistor receiving row-decoding gate signal L1X may be turned-on to select wordline 335. In particular, turning-on such an NMOS transistor in NMOS transistor string 330 may pull-down a voltage (e.g., to ground) on wordline 335, thereby lowering a voltage on respective bases of selector transistors 350, resulting in a selection of memory cells corresponding to wordline 335. In a similar fashion, a second NMOS transistor receiving row-decoding gate signal L2X may be turned-on to select a group of multiple wordlines, such as thirty-two wordlines, for example. Also, a third NMOS transistor receiving row-decoding gate signal L3X may be turned-on to select an additional group of multiple wordlines, such as two-hundred-fifty-six wordlines, for example. Of course, such numbers of wordlines in a group may vary, and claimed subject matter is not limited in this respect. In another implementation, wordline or row decoding may involve selecting a wordline using a combination of decoding signals. For example, if one L1X NMOS transistor (e.g., among 32 such NMOS transistors) is turned-on, one L2X NMOS transistor (e.g., among 8 such NMOS transistors) is turned-on, and one L3X NMOS transistor (e.g., among 8 such NMOS transistors) is turned-on, then a unique wordline (e.g., among 2048 such wordlines) may be selected. However, more than one L1X, L2X, or L3X NMOS transistors may be turned-on simultaneously, and in such a case, more than one wordline may be selected.

In a particular embodiment, wordline de-selection (pull-up) may be performed using pull-up resistor 310. Turning-off NMOS transistors in NMOS transistor string 330 may pull-up a voltage (e.g., to a supply voltage VHX) on wordline 335, thereby raising a voltage on respective bases of selector transistors 350, resulting in a de-selection of memory cells corresponding to wordline 335. In one implementation, one pull-up resistor (or one contiguous group of pull-up resistors) may deselect one wordline. A value of resistance for a pull-up resistor may be selected based, at least in part, on desired performance speed and power consumption of a memory device. For example, wordline driver 300 may include a pull-up resistor having a relatively high resistance to provide a relatively low voltage during wordline selection so that power consumption is relatively low. On the other hand, wordline driver 300 may include a pull-up resistor having a relatively low resistance so that inherent resistor-capacitor (RC) time constants are relatively fast during transitions from one read/write operation to a subsequent read/write operation. Such wordline driver operation speed issues are discussed below. Of course, details of wordline drivers discussed above are merely examples, and claimed subject matter is not so limited.

Figure 4:
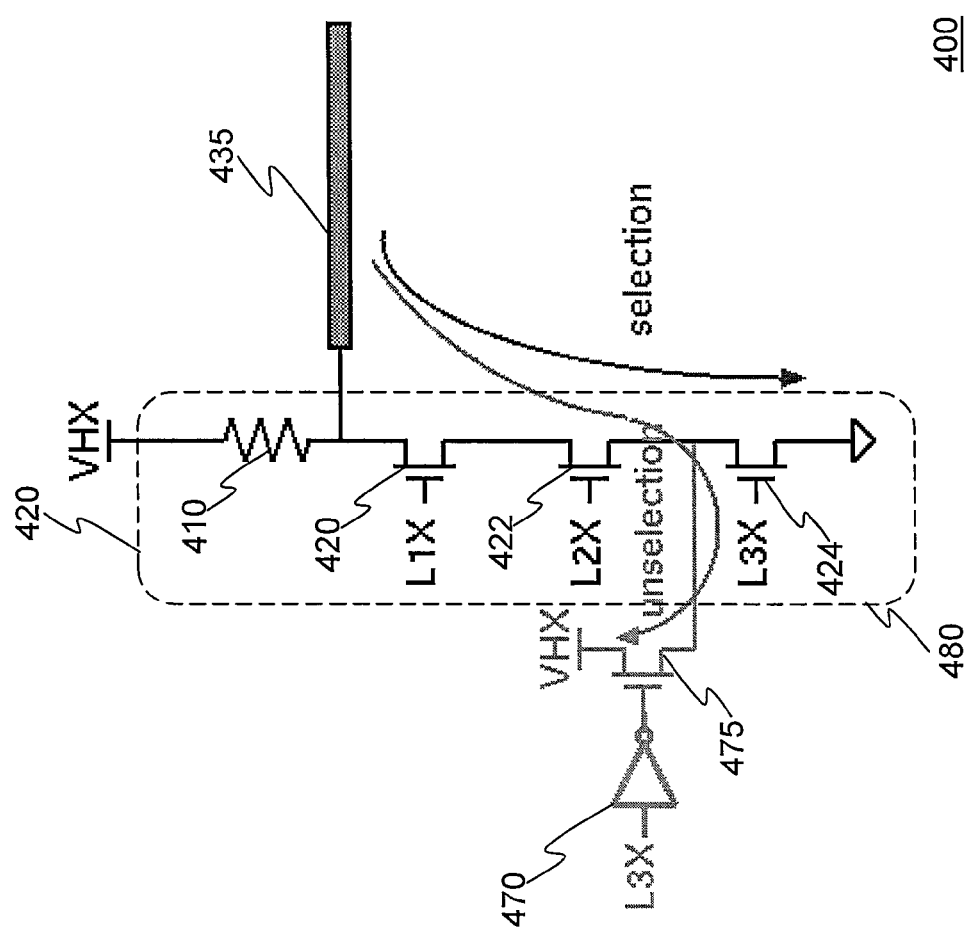

FIG. 4 is a schematic circuit diagram of a wordline driver 400 that includes an additional transistor, according to an embodiment. Such an additional transistor 475 may comprise an NMOS transistor to inject electrical current into PUPD string 420 between two consecutive pull-down transistors 422 and 424, for example. Inclusion of such an additional transistor to inject electrical current may lead to deselecting a wordline at a rate faster than that performed without said injected electrical current. For example, a pull-up process may be performed while including an additional NMOS transistor. Subsequent to a read operation, two levels of row decoding via pull-down transistors 422 and 420 may be left unchanged for a particular time (e.g., several nanoseconds) while a third level of row decoding via pull-down transistors 424 may be turned off. Consequently, the additional NMOS transistor may turn on to allow a relatively fast pull-up of wordline 435. Adding an ability to inject electrical current to improve operating speed of wordline driver may be achieved by adding one NMOS transistor and inverter (which may be implemented by a PMOS-NMOS transistor pair) to a third level of row decoding. Accordingly, area of a memory device occupied by incorporating such an approach to improving operating speed may be relatively low compared to other approaches that, for example, may involve more than one additional transistor.

In one implementation, a base of additional transistor 475 may receive electrical signals inverted with respect to electrical signals applied to a pull-down transistor 424 included in PUPD string 420. Accordingly, if such an applied signal is relatively high (e.g., logic high voltage), then pull-down transistor 424 may be turned on to electrically connect wordline 435 to ground node 480 (or other relatively low voltage node comprising a voltage sink). As a result, pull-down transistor 424 may pull-down a voltage of wordline 435 while inverted applied signal may turn off additional transistor 475 to electrically isolate wordline 435 from a power supply voltage VHX. On the other hand, if such an applied signal is relatively low (e.g., logic low voltage), then pull-down transistor 424 may be turned off to isolate wordline 435 from ground node 480 so that pull-up resistor 410 may pull-up a voltage of wordline 435. Meanwhile, inverted applied signal may turn on additional transistor 475 to electrically connect wordline 435 to power supply voltage VHX in order to deselect wordline 435 at a rate faster than that performed without such an electrical connection to power supply voltage VHX. Of course, such details of a wordline driver are merely examples, and claimed subject matter is not so limited.

Figure 5:
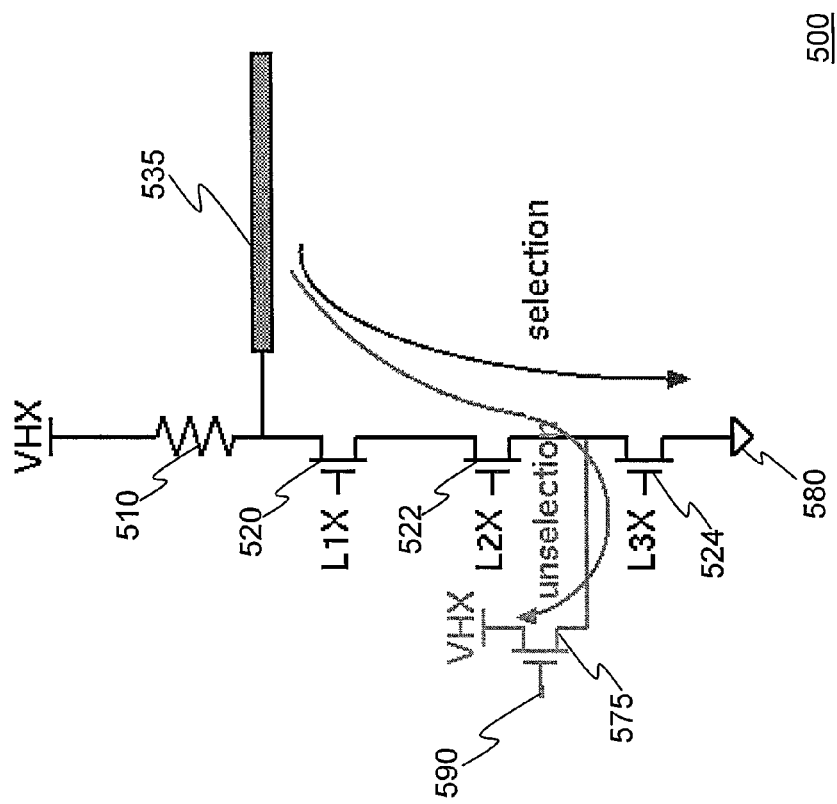

FIG. 5 is a schematic circuit diagram of a wordline driver 500 that includes an additional transistor, according to another embodiment. Such an additional transistor 575 may comprise an NMOS transistor to inject electrical current into PUPD string 520 between two consecutive pull-down transistors 522 and 524, for example. Inclusion of such an additional transistor to inject electrical current may lead to deselecting a wordline at a rate faster than that performed without said injected electrical current. Operation of such an additional transistor may be similar to that described above for wordline driver 400 in FIG. 4, for example. In one implementation, a base of additional transistor 575 may receive an electrical signal comprising a global signal 590 provided by a memory controller, such as memory controller 815 shown in FIG. 8, for example. Such a global signal may be applied to the base of additional transistor 575 to selectively turn on/off additional transistor 575 with time coordination relative to read/write operations of one or more rows of memory. For example, a pull-up process may be performed subsequent to a read operation as described above. In particular, two levels of row decoding via pull-down transistors 522 and 520 may be left unchanged for a particular time (e.g., several nanoseconds) while a third level of row decoding via pull-down transistors 524 may be turned off. Consequently, the additional NMOS transistor may turn on via global signal 590 to allow a relatively fast pull-up of wordline 535. Adding an ability to inject electrical current to improve operating speed of wordline driver may be achieved by adding one NMOS transistor to a third level of row decoding. Accordingly, area of a memory device occupied by incorporating such an approach to improving operating speed may be relatively low compared to other approaches that, for example, may involve more than one additional transistor and/or an inverter. Of course, such details of a wordline driver are merely examples, and claimed subject matter is not so limited.

FIG. 6 is a schematic circuit diagram of and FIG. 7 is a cross-section view of a wordline driver and a portion of a memory array, according to an embodiment. For example, a PUPD string 620 may be connected at node 655 to a row of memory cells 645, which may comprise a storage unit 660 and a selector transistor 650. PUPD string 620 may comprise a series of transistors 630 connected to a pull-up resistor 610 on a substrate 795 at or near an edge of a memory cell array 640/740. In one implementation, an edge of memory cell array 640 may comprise a beginning region of a word line 635 that extends to bases of selector transistors 650. Word line 635 may connect to a power supply voltage VHX via pull-up resistor 610.

As shown in FIG. 7, storage unit 760 may be located on p-emitter diffusion 763 and an n-base diffusion 765 that form a portion of a selector transistor 650/750. A metal line 788 may comprise node 655/755 electrically connecting pull-up resistor 610/710 to pull-down transistors 650/750. In one implementation, n-base diffusion 765 may be fabricated in a same process that fabricates pull-up resistor 610/710. For example, an n-type semiconductor material may be implanted and/or deposited on a substrate 795 to produce n-base diffusion 765 while, at substantially the same time, implanting the n-type semiconductor material to produce pull-up resistor 610/710. Thus, a single mask may be used to form at least a portion of a memory cell array that includes storage units 660/760 and pull-up resistor 610/710. Such a portion, for example, may comprise a base of a bi-polar junction transistor (BJT) selector. Meanwhile, a p-type semiconductor material may be implanted and/or deposited on substrate 795 to form a p-substrate that may comprise a collector of selector transistor 650/750. In one implementation, metal line 788 may electrically connect to a series of transistors such as transistors 630 shown in FIG. 6. n-base diffusion 765, comprising a word line, may electrically connect to a power supply voltage VHX via pull-up resistor 610/710. Of course, such details of a wordline driver are merely examples, and claimed subject matter is not so limited.

Figure 8:
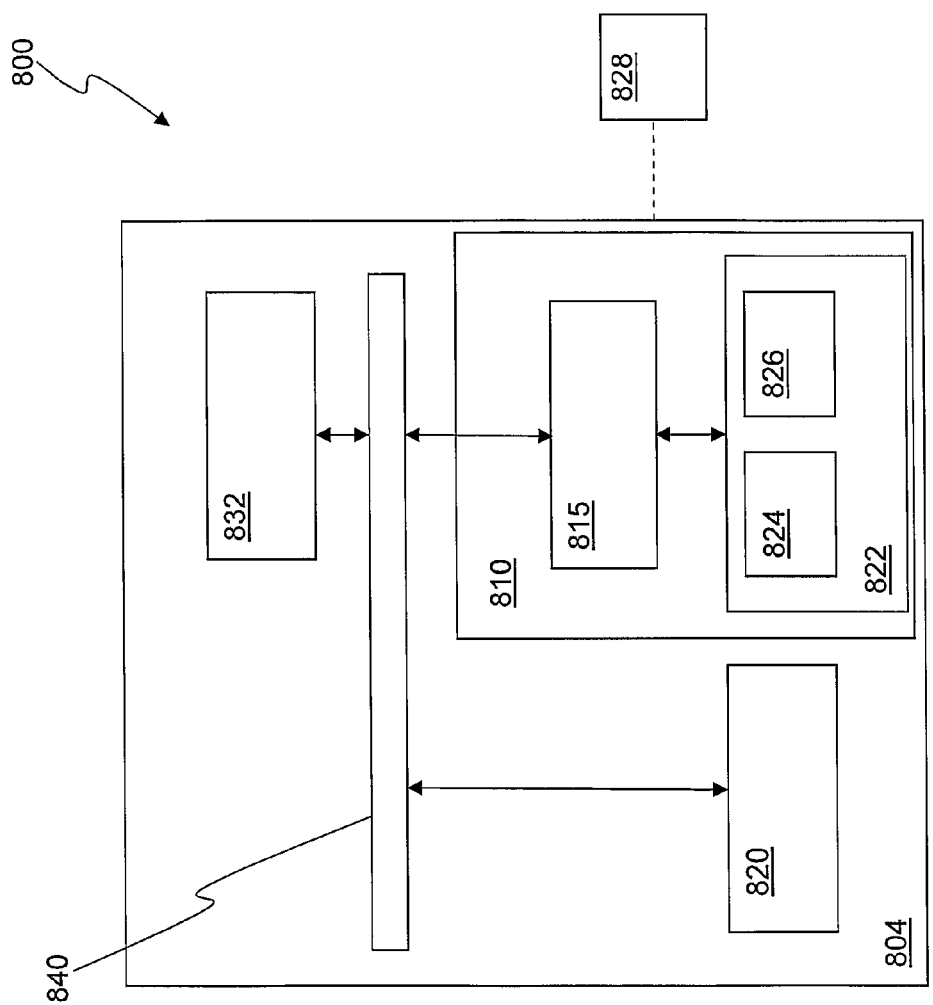
FIG. 8 is a schematic diagram of a computing system and a memory device, according to an embodiment.

FIG. 8 is a schematic view of a computing system and a memory device, according to an embodiment. Such a computing device may comprise one or more processors, for example, to execute an application and/or other code. For example, memory device 810 may comprise memory array 340 shown in FIG. 3. A computing device 804 may be representative of any device, appliance, or machine that may be configurable to manage memory device 810. Memory device 810 may include a memory controller 815 and a memory 822. By way of example but not limitation, computing device 804 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 800 may be implemented using or otherwise including hardware, firmware, software, or any combination thereof. Thus, by way of example but not limitation, computing device 804 may include at least one processing unit 820 that is operatively coupled to memory 822 through a bus 840 and a host or memory controller 815. Processing unit 820 is representative of one or more circuits configurable to perform at least a portion of a data computing procedure or process. By way of example but not limitation, processing unit 820 may include one or more processors, controllers, microprocessors, microcontrollers, application specific integrated circuits, digital signal processors, programmable logic devices, field programmable gate arrays, and the like, or any combination thereof. Processing unit 820 may include an operating system configured to communicate with memory controller 815. Such an operating system may, for example, generate commands to be sent to memory controller 815 over bus 840. Such commands may comprise read and/or write commands. In response to a write command, for example, memory controller 815 may provide a bias signal, such as a set or reset pulse to write information associated with the write command to a memory partition, for example. In an implementation, memory controller 815 may operate memory device 810, wherein processing unit 820 may host one or more applications and/or initiate write commands to the memory controller to provide access to memory cells in memory device 810, for example.

In one embodiment, a system may comprise a memory controller to operate a memory device, wherein the memory device may comprise memory cells of a memory cell array addressable via a wordline, a PUPD string to select or deselect the wordline responsive to electronic signals generated by decoding a command. Such a PUPD may include a pull-up resistor electrically connected between the wordline and a voltage source to deselect the wordline and/or pull-down transistors serially connected to the pull-up resistor in the PUPD string and electrically connected between the wordline and a current sink to select the wordline. Such a system may further comprise a processor to host one or more applications and to initiate commands to the memory controller to provide access to the memory cells in the memory cell array.

Memory 822 is representative of any data storage mechanism. Memory 822 may include, for example, a primary memory 824 and/or a secondary memory 826. Primary memory 824 may include, for example, a random access memory, read only memory, etc. While illustrated in this example as being separate from processing unit 820, it should be understood that all or part of primary memory 824 may be provided within or otherwise co-located/coupled with processing unit 820.

Secondary memory 826 may include, for example, the same or similar type of memory as primary memory and/or one or more data storage devices or systems, such as, for example, a disk drive, an optical disc drive, a tape drive, a solid state memory drive, etc. In certain implementations, secondary memory 826 may be operatively receptive of, or otherwise configurable to couple to, a computer-readable medium 828. Computer-readable medium 828 may include, for example, any medium that can carry and/or make accessible data, code, and/or instructions for one or more of the devices in system 800.

Computing device 804 may include, for example, an input/output 832. Input/output 832 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 832 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A memory device comprising:
   memory cells of a memory cell array which are addressable via a wordline;
   a pull-up-pull-down (PUPD) string to select or deselect said wordline, said PUPD string comprising:
      pull-down transistors electrically connected between said wordline and a current sink to select said wordline; and
      one or more pull-up resistors electrically connected between said wordline and a voltage source to deselect said wordline, wherein said one or more pull-up resistors are serially connected to said pull-down transistors, and
      an additional transistor to inject electrical current into said PUPD string between a consecutive two of said pull-down transistors to deselect said wordline at a rate faster than deselection of said wordline performed without said injected electrical current.

2. The memory device of claim 1, wherein said one or more pull-up resistors comprise silicon diffusion on or near an edge of said memory cell array.

3. The memory device of claim 2, wherein said silicon diffusion comprises an n-type material implanted in a silicon substrate.

4. The memory device of claim 1, wherein said one or more pull-up resistors comprise silicon diffusion on or near a beginning of said word line that extends to bases of said memory cells.

5. The memory device of claim 1, further comprising an inverter electrically connected between a base of one of said consecutive two pull-down transistors and a base of said additional transistor.

6. The memory device of claim 1, wherein said pull-down transistors comprise NMOS transistors.

7. A method comprising:
   forming a wordline on a substrate to address memory cells of a memory cell array; and
   forming one or more pull-up resistors on said substrate, said one or more pull-up resistors to raise a voltage to deselect said wordline; and
   forming a transistor to inject electrical current between two consecutive pull-down transistors serially connected to said one or more pull-up resistors to deselect said wordline at a rate faster than deselection of said wordline performed without said injected electrical current.

8. The method of claim 7, further comprising
   forming said memory cell array and said one or more pull-up resistors at substantially the same time using a same mask.

9. The method of claim 7, wherein said one or more pull-up resistors are formed using silicon diffusion.

10. The method of claim 9, wherein said silicon diffusion comprises an n-type material implanted in said substrate.

11. The method of claim 10, wherein an edge of said memory cell array comprises a beginning of said word line that extends to bases of said memory cells.

12. The method of claim 7, further comprising:
   forming an inverter to electrically connect a base of one of said two consecutive pull-down transistors and a base of said additional transistor.

13. The method of claim 7, wherein said two consecutive pull-down transistors comprise an NMOS transistor.

14. A system comprising:
   a memory controller to operate a memory device, said memory device comprising:
      memory cells of a memory cell array which are addressable via a wordline;
      a pull-up-pull-down (PUPD) string to select or deselect said wordline responsive to electronic signals generated by decoding a command, wherein said PUPD includes one or more pull-up resistors electrically connected between said wordline and a voltage source to deselect said wordline;
      pull-down transistors serially connected to said one or more pull-up resistors in said PUPD string and electrically connected between said wordline and a current sink to select said wordline; and
      an additional transistor to inject electrical current into said PUPD string between a consecutive two of said pull-down transistors to deselect said wordline at a rate faster than deselection of said wordline performed without said injected electrical current; and
   a processor to host one or more applications and to initiate said command to said memory controller to provide access to said memory cells in said memory cell array.

15. The system of claim 14, wherein said pull-down transistors comprise NMOS transistors.

16. The system of claim 14, wherein said one or more pull-up resistors comprise silicon diffusion on or near an edge of said memory cell array.

* * * * *

UNITED STATES PATENT AND TRADEMARK OFFICE
CERTIFICATE OF CORRECTION

| | | |
|---|---|---|
| PATENT NO. | : 8,159,899 B2 | Page 1 of 1 |
| APPLICATION NO. | : 12/779752 | |
| DATED | : April 17, 2012 | |
| INVENTOR(S) | : Efrem Bolandrina et al. | |

It is certified that error appears in the above-identified patent and that said Letters Patent is hereby corrected as shown below:

In column 7, lines 55-56, in Claim 1, delete "transistors," and insert -- transistors; --, therefor.

In column 8, line 13, in Claim 7, after "array;" delete "and".

Signed and Sealed this
Nineteenth Day of June, 2012

David J. Kappos
*Director of the United States Patent and Trademark Office*